Figure 1:
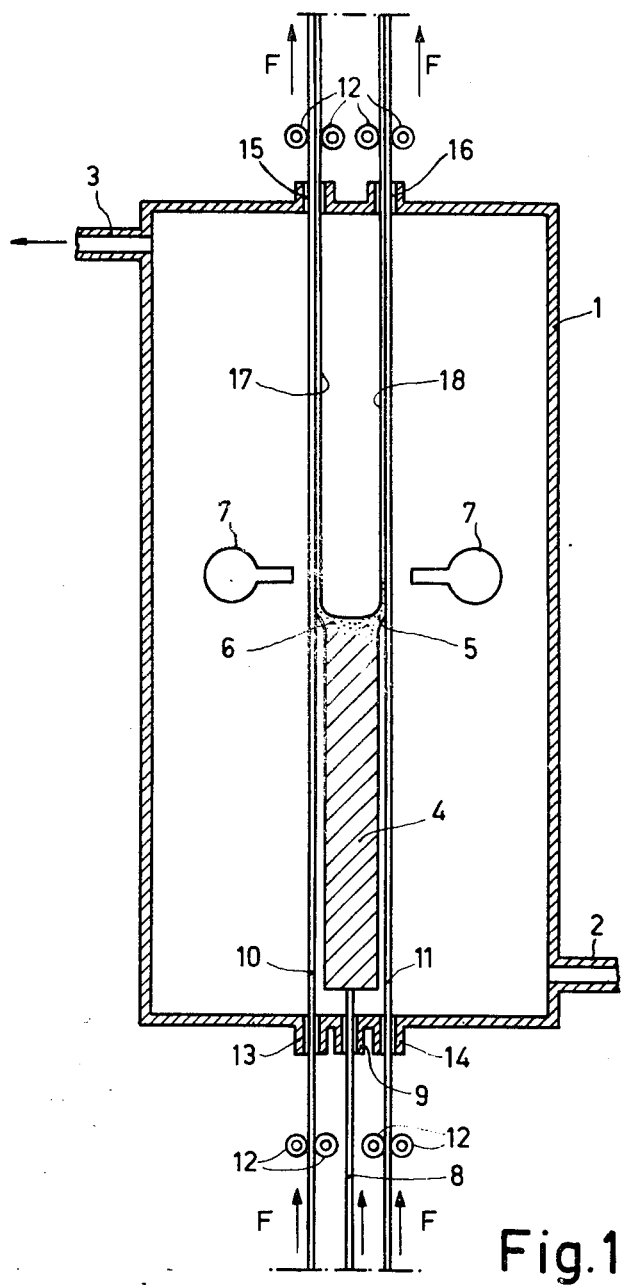

United States Patent [19]

Brissot et al.

[11] 4,119,744
[45] Oct. 10, 1978

[54] METHOD OF MANUFACTURING SEMICONDUCTOR DEVICES IN WHICH A LAYER OF SEMICONDUCTOR MATERIAL IS PROVIDED ON A SUBSTRATE

[75] Inventors: Jean-Jacques Lucien Emile Brissot, Maisons Alfort; Christian Belouet, Sceaux; René Martres, Argentueil, all of France

[73] Assignee: U.S. Philips Corporation, New York, N.Y.

[21] Appl. No.: 816,387

[22] Filed: Jul. 18, 1977

Related U.S. Application Data

[63] Continuation of Ser. No. 654,940, Feb. 3, 1976, abandoned.

[30] Foreign Application Priority Data

Feb. 7, 1975 [FR] France .................................. 75 03926
Sep. 26, 1975 [FR] France .................................. 75 29556

[51] Int. Cl.² ........................... B05D 5/12; B01D 9/02
[52] U.S. Cl. ........................ 427/45; 422/249; 427/46; 427/86; 427/87; 427/113; 427/398 R; 427/434 A; 156/604; 156/607; 156/620; 156/DIG. 64; 23/295 R
[58] Field of Search .............. 427/86, 113, 434 A, 427/45, 46, 398, 87; 156/604, DIG. 64, 607, 620; 23/273 Z, 295 R; 118/404, 407, 400, 423

[56] References Cited

U.S. PATENT DOCUMENTS

| | | | |
|---|---|---|---|
| 2,147,293 | 2/1939 | Hansen | 264/215 |
| 2,414,680 | 1/1947 | Wert | 156/604 |
| 3,032,816 | 8/1962 | Zimmerli | 264/215 |
| 3,096,158 | 7/1963 | Gaule | 156/600 |
| 3,961,997 | 6/1976 | Chu | 427/113 |
| 3,969,163 | 7/1976 | Wakefield | 427/113 |
| 3,996,094 | 12/1976 | Lesk | 156/DIG. 64 |

*Primary Examiner*—Michael F. Esposito
*Attorney, Agent, or Firm*—Frank R. Trifari

[57] ABSTRACT

A method of manufacturing semiconductor devices comprising a layer of semiconductor material, comprising the steps of providing a strip-shaped solid substrate having a main surface and providing a solid support having a substantially horizontal surface and comprising a substantially floating liquid mass of such semiconductor material on the substantially horizontal surface, the main surface being wettable by the liquid semiconductor material. The liquid mass is contacted with the main surface of said substrate, onto which substrate the layer of semiconductor material is to be provided, the substrate is moved in its longitudinal direction along and in contact with said liquid mass so that a liquid layer of said semiconductor material is formed on said strip and taken along with it, and the liquid layer is substantially progressively solidified.

21 Claims, 3 Drawing Figures

METHOD OF MANUFACTURING SEMICONDUCTOR DEVICES IN WHICH A LAYER OF SEMICONDUCTOR MATERIAL IS PROVIDED ON A SUBSTRATE

This is a continuation of application Ser. No. 654,940 filed Feb. 3, 1976, now abandoned.

The present invention relates to a method of manufacturing semiconductor devices in which a layer of semiconductor material is provided on a main surface of a solid substrate by solidification of molten semiconductor material on said substrate surface. The invention further relates to an apparatus for use in carrying out said method and semiconductor devices made by using such a method.

The semiconductor material used so far was monocrystalline and in general in the form of discs cut from rods obtained by the vertical drawing according to the Czochralski method or by the method of floating zone melting. Actually, the high cost-price limits the development of devices using said material, especially devices which are to be used in large areas, for example for the direct conversion of solar energy into electrical energy. For this purpose single crystal silicon slices are used, but also other semiconductors of the III-V type and II-VI type, eventually with hetero-junctions with other materials are known for said purpose.

Experience has proved that good conversion efficiencies can also be obtained by using polycrystalline silicon. French patent specification No. 1,343,740 discloses cells which are manufactured comprising polycrystalline silicon in graphite receptacles of very small depth. Cooling may be carried out progressively in a horizontal direction. Polycrystalline material may be obtained in this manner having grain sizes sufficient to give photodiodes manufactured from said material a conversion efficiency of the order of 6%.

It is an object of the present invention to enable the manufacture of layers of semiconductor material of large area in a process which may be carried out substantially continuously. According to the invention a method of manufacturing semiconductor devices in which a layer of semiconductor material is provided on a main surface of a solid substrate by solidification of molten semiconductor material on said substrate surface, is characterized in that a substantially floating liquid mass of the semiconductor material is formed on a substantially horizontal surface of a solid support, that said liquid mass is contacted with the said main surface of the solid substrate onto which the layer of semiconductor material is to be provided, the latter main surface being wettable by the liquid semiconductor material and the solid substrate having the form of a strip, and that said strip is moved in its longitudinal direction along the liquid mass so that a liquid layer of the semiconductor material is formed on said strip and taken along with it, said liquid layer being solidified substantially progressively. It is found that the method according to the invention can successfully be used for manufacturing layers of silicon, which may in this relatively simple manner be obtained in polycrystalline form of suitable quality for the manufacture of solar cells of acceptable conversion efficiencies not withstanding the requirement of heating at a temperature of at least 1420° C. for obtaining liquid silicon. However, the invention is not limited to the use of silicon and may, in principle be used in case of other semiconductor materials which can be melted, such as germanium and many compounds of the III-V type.

The term "substantially floating" with respect to the liquid mass in this case means, that the liquid mass is not fully enclosed laterally by solid walls. The liquid mass may hang on the substantially horizontal surface at the underside of the support due to adhesive forces in conjunction with cohesive forces. In that case the substrate will contact the liquid mass at a place lower than the substantially horizontal support surface. A danger exists in that case that at least a major part of the volume of the molten mass may loosen itself from the support and run along the substrate thus breaking the contact between the mass still hanging on the substantially horizontal support surface and the substrate surface to be covered with the layer of semiconductor material. This danger is at least reduced when according to a preferred embodiment the liquid mass of semiconductor material is positioned on top of a substantially horizontal surface constituting the upper surface of the support, the liquid mass projecting above said support. The place of contact between the liquid mass and the substrate for providing the layer of semiconductor material will then be situated above the substantially horizontal support surface or at least at about the same level as said support surface.

The term "substantially horizontal" for the surface of the support onto which the liquid mass is provided, should be understood to mean that, if deviating from absolutely horizontal, the liquid mass will not be able to run off or drop off said surface and that, in case of being the upper surface of the support, the liquid mass would have been run off for the major part in case the only forces acting on the molten mass would have been gravitational forces. The molten mass may be kept in place due to surface tension caused by cohesive forces.

The support may comprise a high purity refractory material at the substantially horizontal surface, for example high purity silicon oxide in the case of silicon. Molten semiconductor material taken up by the substrate may be replenished by adding liquid semiconductor material by means of one or more capillary channels in the support opening at the said substantially horizontal surface said capillary channels receiving liquid semiconductor material from a molten pool contacting the support at another place than the substantially horizontal surface. However, it is also possible to replenish said liquid mass by adding semiconductor material in powder form.

According to a further preferred embodiment the solid support consists of the semiconductor material in solid form. This has the advantage that the material of the support may have the same or even higher purity than the semiconductor material of the liquid mass itself. This liquid mass may be formed initially by melting an end portion of the solid material of the support. The liquid mass may form a hanging drop or, according to a preferred embodiment, it may substantially float on top of the support. Suitable heating means may be used for creating a substantially horizontal liquid solid interface forming also the substantially horizontal surface of the support for the liquid mass of semiconductor material. In case of a support consisting of the semiconductor material itself replenishment of liquid semiconductor material removed from the mass by the substrate may, according to a preferred embodiment, be realized by progressively melting adjacent semiconductor material of the support.

In principle it is possible to move the strip along and in contact with the liquid mass on the substantially horizontal support surface in any given direction. It may be moved horizontally at the area of contact with the liquid mass. In the case of a molten mass hanging at the lower end of the support the layer of semiconductor material will be formed on the upper surface of the strip-shaped substrate. In the case of a molten mass on top of the support the layer of semiconductor material will be formed on the lower surface of the strip-shaped substrate. In the first case the amount of material passing to the substrate may be rather abundant such that the layer is rather thick and difficulties may arise in replenishing the liquid mass on the support surface. In the second case care should be taken to adjust the parameters such that no uneven thicknesses are formed due to the initial formation of hanging drops at the substrate surface before solidification.

In principle also a downward movement of the strip-shaped substrate may be used. However, care should be taken for an even pick-up of molten semiconductor material by the substrate surface in order to obviate local accumulation of semiconductor material running down over already solidified material.

According to a preferred embodiment the substrate is moved in an upward direction. In this way the chance of obtaining layers of uneven thicknesses is diminished as any momentarily increased amount of liquid picked up by the substrate will flow back and may either be added to a next decreased amount of liquid picked up in a subsequent moment from the somewhat reduced liquid mass on the support surface, or may flow back to said liquid mass.

The invention further relates to an apparatus for use in carrying out method according to the invention, said apparatus being characterized in that it comprises a closed space having inlet and outlet means for control of the gaseous atmosphere in said space, means for vertically placing a longitudinal support for the substantially floating liquid mass of semiconductor material to be positioned on top of said support, heating means for heating the liquid mass of semiconductor material and means for passing a strip-shaped substrate in its longitudinal direction in close proximity along the upper portion of the support for carrying the mass of molten semiconductor material such that said strip-shaped substrate contacts the liquid mass of the semiconductor material.

The apparatus may comprise means for adding semiconductor material in powder form to the liquid mass.

Preferably the apparatus comprises means to vertically move the support for the liquid mass during the formation of the layer of semiconductor material on the substrate surface. In this way the semiconductor material for the molten mass may be properly brought in a position with respect to the heating means that the molten mass is formed and that said molten mass is properly contacted with the substrate surface. In case the support consists of the semiconductor material said support may be advanced in the direction of the liquid mass in order to replenish said molten mass as already mentioned herein.

The support may be given a variety of forms within the scope of the present invention. For obtaining substantially broad semiconductor layers it is advantageous to have a contact area between the strip-shaped substrate and the molten mass which is substantially large in a direction perpendicular to the direction of movement of the strip at the area of contact with the liquid mass. For this purpose, according to a preferred embodiment, the substantially horizontal surface of the support of the liquid mass is bounded by a substantially straight-lined edge, substantially according to the length of said substantially horizontal surface, the strip passing in close proximity of said edge. The support may to this end have the form of a parallelepiped. Such a parallelepiped having two parallel edges of the same length may enable the use of two substrates each positioned in proximity of one of these parallel edges.

In order to limit contact between the liquid mass and the support to the substantially horizontal surface, especially in case said liquid mass is positioned on top of said support in which danger exist of flowing over an edge of the substantially horizontal surface, it is desired to use substantially sharp edges at the circumference of the substantially horizontal surface. According to a preferred embodiment edges of the substantially horizontal surface of the body constitute edges of substantially vertically positioned surfaces of the support. For example, all surfaces bounding the substantially horizontal support surface may be positioned vertically. In case of a support of the semiconductor material itself it has the further advantage that in replenishing the liquid mass by advancing the support in the direction of said liquid mass the area and form of the solid liquid interface and also of the liquid mass itself may be kept constant.

According to a further preferred embodiment high-frequency induction heating is used for heating the liquid mass. In comparison with radiation heating in a furnace, high-frequency induction heating may better be limited to a desired area, i.e., to substantially the liquid mass of semiconductor material itself. In this way not only the danger of contamination of the semiconductor material by impurities originating from other heated parts is decreased, but also the liquid film adhered to the moving substrate is more quickly solidified. Moreover, the strip-shaped substrate, due to its form, may be kept at a relatively low temperature before contacting the liquid mass thus reducing the risk of contaminating the semiconductor material. Further, in the high frequency magnetic field forces may be exerted on the liquid mass which, in addition to surface tension, aids in keeping said liquid mass in position on the substantially horizontal substrate surface.

In order to enable a substantially continuous process using strips of substantial length it is preferable that said strips should be flexible. Such a strip may initially have been wound up on a reel such that it can be wound off during the process of providing the semiconductor layer. In flexible condition it further can better be guided along the liquid mass.

A condition is that at least the main surface of the strip, onto which the layer of semiconductor material has to be provided, can be wetted by the liquid semiconductor material. The wettable angle preferably should be not larger than 20°. In this respect the term "wettable angle" with respect to a given liquid and a given surface which is wettable by said liquid should be understood to mean herein the angle between the meniscus of the given liquid and the given surface at the junction between them when said surface is partly inset in said liquid in vertical position. As the wettability is larger the rising of the liquid against the wall is larger and the wettable angle is smaller.

It is possible to use several materials for the strip. The strip may comprise an insulating refractory material.

According to a preferred embodiment the electrically conducting refractory material may be used as a material for the strip. Refractory metals may be used as electrically conducting material for the strip. Metals can be put in the form of flexible foils. Another refractory material is elemental carbon. Carbon in the form of graphite or in amorphous form may show suitable wettability by molten silicon and is further electrically conducting. It may be used in the form of a coating of less wettable material. The substrate may also consist entirely of carbon.

In case the material to be used in the strip is rather hard and brittle such that it is difficult to use it as the main material of the strip in compact form such materials, i.e., carbon or ceramic materials, may be used in fibrous form in order to obtain flexibility of the strip. So carbon is available in fibrous form such as graphite felt and carbon tissue. Such fibrous carbon may in known manner be obtained by carbonization of fibres of organic materials.

When the strip consists of electrically conducting material it may be used afterwards as electric contact for the semiconductor devices subsequently made from the layer of semiconductor material obtained.

At the area of contact with the liquid mass of semiconductor material on the substantially horizontal surface of the support the strip used as a substrate for the layer of semiconductor material to be formed may be used in a vertical position and preferably moved upwards. For establishing contact between the liquid mass and the strip the liquid mass may be used in an amount such that initially it protrudes already laterally beyond the edge of the substantially horizontal substrate surface. It is also possible to move the strip towards the liquid mass in order to establish contact with it and that on returning the strip to its initial position free from the support the liquid mass is deformed due to adhesion to the substrate surface such that said contact is maintained.

It has further been found that the thickness of the layer of semiconductor material formed on the substrate may, according to a further preferred embodiment, be controlled by giving the strip a suitable inclination at the place of contact with the liquid mass. To this end the apparatus according to the present invention comprises means for adjusting the inclination of the strip-shaped substrate at said place.

The invention will now be described in greater detail with reference to the accompanying drawings, in which, FIG. 1 shows schematically an apparatus for carrying out an embodiment of the method according to the invention using two movable substrates.

Figure 2:
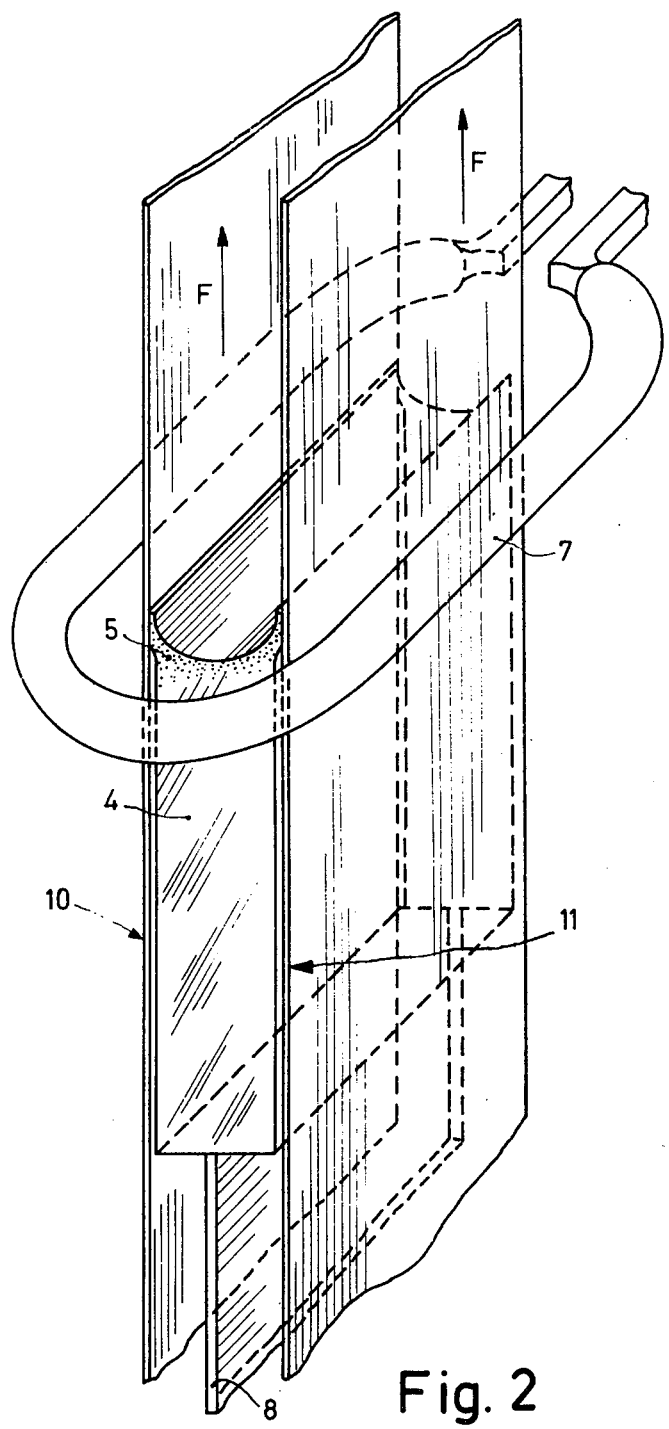
Figure 3:
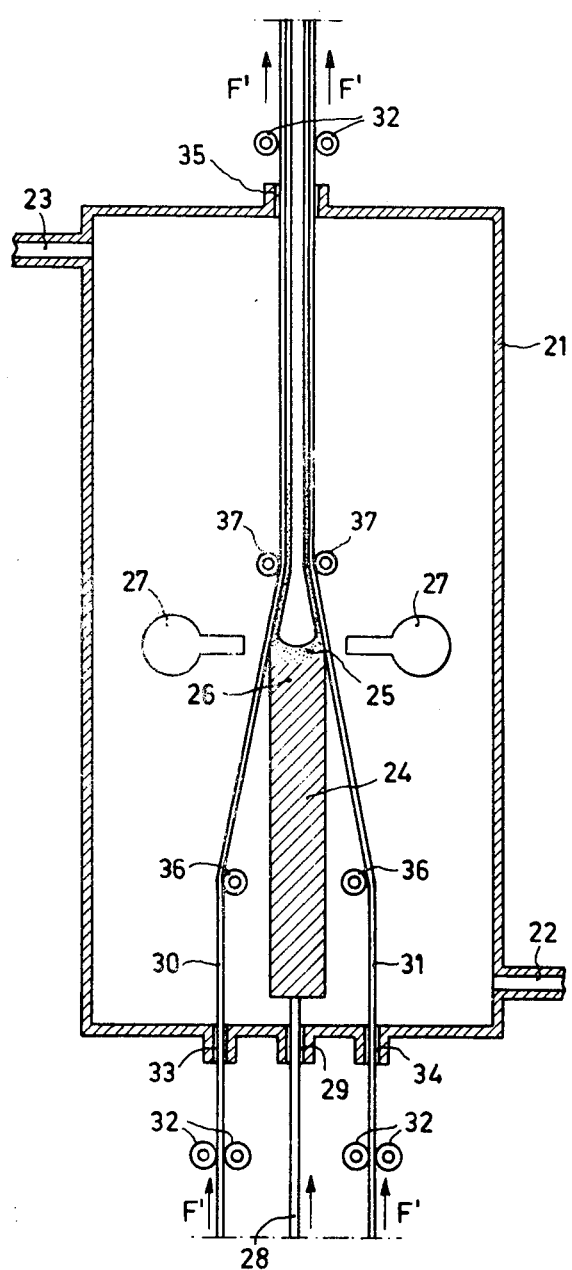

FIG. 2 is an isometric projection on an enlarged scale of a part comprising a support in the form of a polycrystalline body positioned between two movable substrates and a high frequency coil, FIG. 3 shows another apparatus for carrying out another embodiment of the method according to the invention.

FIG. 1 shows a closed space 1 having metal walls and comprising at least one inlet and one outlet, 2 and 3, respectively, permitting the creation of an inert atmosphere. Placed vertically in the centre is a body 4 of polycrystalline silicon which forms a support for a liquid mass 5 of molten silicon which will be produced at the upper end 6 of the support 4 with the aid of heating means, for example comprising a high-frequency coil 7.

The support 4 is held at the end of a vertical bar 8 which enters the space 1 through an aperture 9. Disposed on either side of the support 4 are substrates in the form of strips 10 and 11 which are symmetric with respect to the support 4. The strips 10 and 11 which are held by guiding means 12 enter the space 1 through apertures 13 and 14, respectively, and leave the upper part of space 1 through the apertures 15 and 16.

The said strips 10 and 11 are moved in the direction of the arrows F by using driving means not shown.

FIG. 2 shows the polycrystalline silicon body 4 which forms the support for the liquid mass 5 which is formed by heating using the high-frequency coil 7. On either side of the support 4 are disposed strips 10 and 11 which are symmetric with respect to the support 4. The strips 10 and 11 are driven in the direction of the arrows F by driving means not shown in the Figure.

The method is carried out as follows. The upper end 6 of the silicon body 4 is heated so as to form the liquid mass 5 of molten silicon, on a substantially horizontal solid liquid interface forming the upper surface of the support. The support may consist of pure silicon eventually suitably doped if desired.

As a result of the near presence of the strips 10 and 11 manufactured from a material which can be wetted by silicon, in the present case carbon fiber, the silicon of the zone 5 will wet the strips. The strips are moved upwards in the direction of arrow F.

The liquid silicon retained by the substrate strips 10 and 11 is driven by the regular movement in the direction of the arrows F of the supports 10 and 11 and crystallizes in the form of layers 17 and 18, respectively, according as the silicon is moved away from the heating means 7.

In this manner continuous silicon layers are obtained on the support and are collected outside the metal space 1.

By this method silicon strips are obtained having a thickness of the order of about 60 μm, a width of 2 cms and a length of several centimeters on a support, consisting of fibrous carbon, driven at a speed of 20 cm per min. The material was polycrystalline with lateral grain sizes of the order of 300 μm. The average crystal orientation was (211) in the direction of movement of the strip, and (111) in the plane of the layer.

FIG. 3 shows a space 21 comprising at least one inlet and one outlet 22 and 23, respectively, permitting the provision of an inert atmosphere. A support 24 consisting of a body of polycrystalline silicon is placed vertically in the center of the space, a molten zone 25 being formed at the upper end 26 of the rod 24 by high frequency induction with the aid of HF-coil 27. The support 24 is held at the end of a vertical bar 28 which enters the space 21 through an aperture 29. On either side of the support 24 are disposed substrates in the form of strips 30 and 31 which are held by guiding means 32; said strips 30, 31 enter the space 21 through apertures 33 and 34, respectively, and leave at the upper part of the space through the aperture 35 which in this case is common since the two supports approach each other. Suitable means may be employed for establishing a desired inclination of the said strips, said means including replaceable guides 36 and 37, permitting also adjustment of said inclination in the course of forming the layer. The strips 30, 31 are moved in the direction of the arrows F' by driving means not shown in FIG. 3.

In accordance as the inclination of a strip at the area of contacting the liquid mass of molten silicon further deviates from a vertical direction the resulting layer of silicon formed on the substrate is thicker.

Experiments have been carried out in which the angle of inclination of the strip-shaped substrate relative to a vertical direction was increased approximately 10°, wherein the thickness of the silicon layer on a suitable support, for example graphite which is considerably wettable, was increased from 10 microns to 160 microns.

Such results are given only by way of example and do not constitute any limitation of the invention.

The layers thus produced may further be worked in known manner for the manufacture of solar cells having polycrystalline silicon or other semiconductor devices, such as rectifiers. Experiments have been carried out with normal cylindrical rods but it is clear that broader layers may be obtained with silicon supports having the form of a parallelepiped as shown in FIG. 2. As an alternative normally available cylindrical zone refined polycrystalline silicon rods may be sawed lengthwise in two pieces each piece being used as a support (pedestal) of a molten silicon mass on top of it, the substrate strip moving in proximity of the straight edge formed due to the sawing operation.

What is claimed is:

1. A method of manufacturing semiconductor devices comprising a layer of semiconductor material, comprising the steps of:
    (a) providing a strip-shaped solid substrate having a main surface,
    (b) providing a solid support having a substantially horizontal surface and comprising a substantially floating liquid mass of said semiconductor material on said substantially horizontal surface, said main surface being wettable by said liquid semiconductor material,
    (c) contacting said liquid mass with said main surface of said substrate, onto which substrate the layer of semiconductor material is to be provided,
    (d) moving said substrate in its longitudinal direction along and in contact with said liquid mass so that a liquid layer of said semiconductor material is formed on said substrate and taken along with it, and
    (e) substantially progressively solidifying said liquid layer.

2. A method as claimed in claim 1, wherein semiconductor material is silicon.

3. A method as in claim 1, wherein said substantially horizontal surface of said solid support is the upper surface of said support and said liquid mass of said semiconductor material projects above said solid support.

4. A method as in claim 1, wherein said solid support consists of said semiconductor material in solid form.

5. A method as in claim 4, wherein during the formation of said layer, semiconductor material is supplied to said liquid mass by progressively melting said semiconductor material of said support adjacent said liquid mass.

6. A method as in claim 1, wherein said substrate is given an upward movement at the place of contact thereof with said molten mass.

7. A method as in claim 1, wherein said substrate is a flexible strip.

8. A method as in claim 1, wherein said material of said substrate surface has a wettable angle with respect to said liquid semiconductor material of at most 20°.

9. A method as in claim 1, wherein said substrate consists of an insulating refractory material.

10. A method as in claim 1, wherein said substrate consists of an electrically conducting refractory material.

11. A method as in claim 10, wherein said substrate consists of a metallic refractory material.

12. A method as in claim 10, wherein said semiconductor material consists essentially of silicon and said substrate consists essentially of elemental carbon.

13. A method as in claim 1, wherein said substrate consists of fibrous material.

14. A method as in claim 1, wherein said substantially horizontal surface of said support is bounded by a substantially straight-lined edge extending substantially along the length of said substantially horizontal surface, said substrate passing in close proximity to said edge.

15. A method as in claim 14, wherein said support has the shape of a parallelepiped.

16. A method as in claim 1, wherein the edges of said substantially horizontal surface of said support constitute edges of substantially vertically positioned surfaces thereof.

17. A method as in claim 1, wherein, during the formation of said layer of semiconductor material, said mass of liquid semiconductor material is replenished by adding thereto semiconductor material in powder form.

18. A method as in claim 1, wherein said liquid mass of semiconductor material is heated by high-frequency induction.

19. A method as in claim 1, wherein, at the place of contact between said liquid mass of semiconductor material and said main surface of said substrate, said main surface has an inclined position with respect to said substantially horizontal surface of said support.

20. A method as in claim 1, wherein said substrate is moved in a direction transverse to said substantially horizontal surface.

21. A method as in claim 20, wherein said direction is inclined to the vertical at an angle of about 10°.

* * * * *